United States Patent
Lin

(10) Patent No.: US 9,296,006 B2
(45) Date of Patent: Mar. 29, 2016

(54) NOZZLE DEVICE WITH A PLURALITY OF PIEZOELECTRIC PLATE MODULE

(71) Applicant: CHUNG HUA UNIVERSITY, Hsinchu (TW)

(72) Inventor: Jium Ming Lin, Hsinchu (TW)

(73) Assignee: CHUNG HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/860,136

(22) Filed: Sep. 21, 2015

(65) Prior Publication Data

US 2016/0030965 A1 Feb. 4, 2016

Related U.S. Application Data

(62) Division of application No. 14/448,278, filed on Jul. 31, 2014, now Pat. No. 9,168,743.

(51) Int. Cl.
*B41J 2/045* (2006.01)
*B05B 17/00* (2006.01)
*H01L 41/09* (2006.01)
*H01L 41/053* (2006.01)
*H01L 41/047* (2006.01)
*B41J 2/14* (2006.01)

(52) U.S. Cl.
CPC ......... *B05B 17/0646* (2013.01); *B41J 2/14201* (2013.01); *H01L 41/047* (2013.01); *H01L 41/0477* (2013.01); *H01L 41/053* (2013.01); *H01L 41/09* (2013.01); *B41J 2002/14491* (2013.01)

(58) Field of Classification Search
CPC ............... B41J 2/14201; B41J 2/14274; B41J 2002/1491
See application file for complete search history.

(56) References Cited

U.S. PATENT DOCUMENTS 6,505,917 B1 * 1/2003 Gutierrez ............... B41J 2/1612
347/68

* cited by examiner

*Primary Examiner* — Juanita D Jackson
(74) *Attorney, Agent, or Firm* — WPAT, P.C.; Anthony King

(57) ABSTRACT

A nozzle device includes an upper cover module having a cavity, a plurality of stacked piezoelectric plate modules, a plug module, and a lower cover module. Each piezoelectric plate module includes a substrate, a piezoelectric material, an electrical connection, an upper electrode, and a lower electrode. The substrate includes multiple first through holes disposed correspondingly to the cavity. The piezoelectric material is located on the upper surface of the substrate. The electrical connection extends from the lower surface of the substrate, through the substrate, and to the bottom of the piezoelectric material. The lower electrode is located below the lower surface of the substrate and electrically connects to the electrical connection. The plug module includes plugs and second through holes corresponding to the first through holes. The lower cover module includes openings disposed according to the plugs of the plug module.

8 Claims, 6 Drawing Sheets

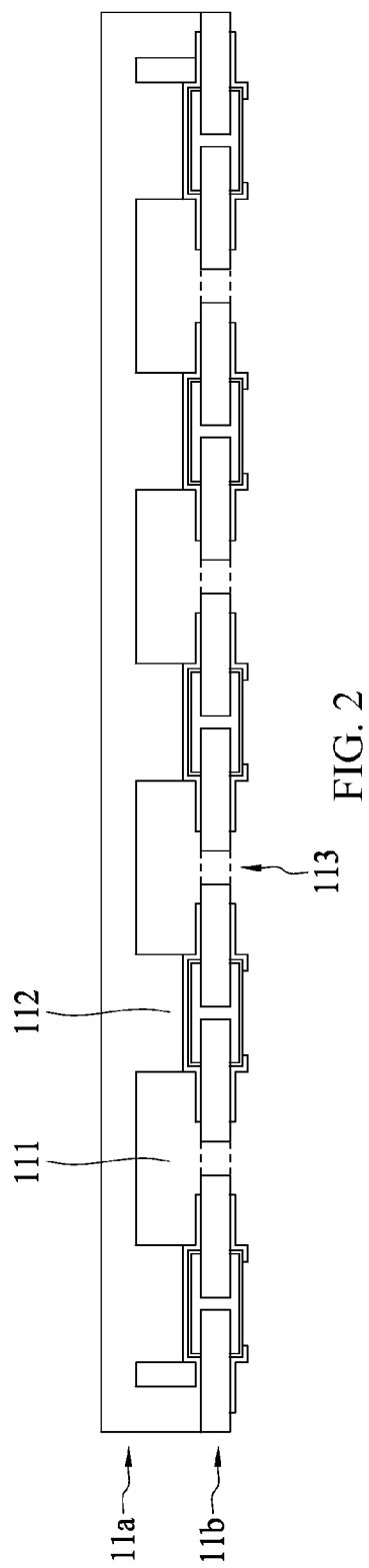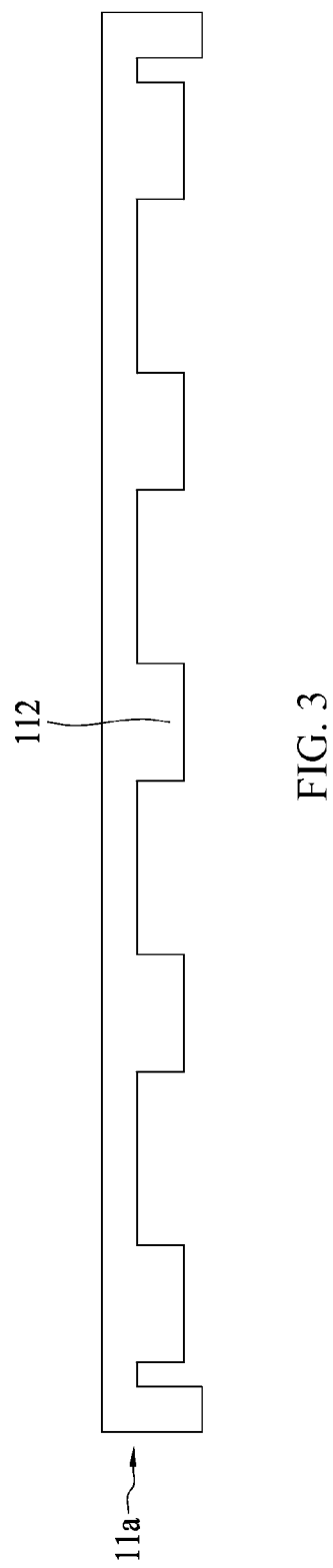

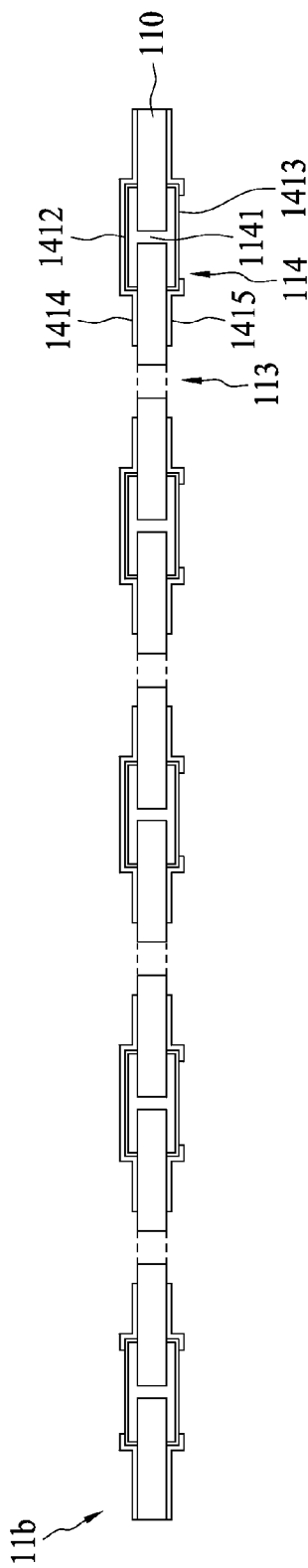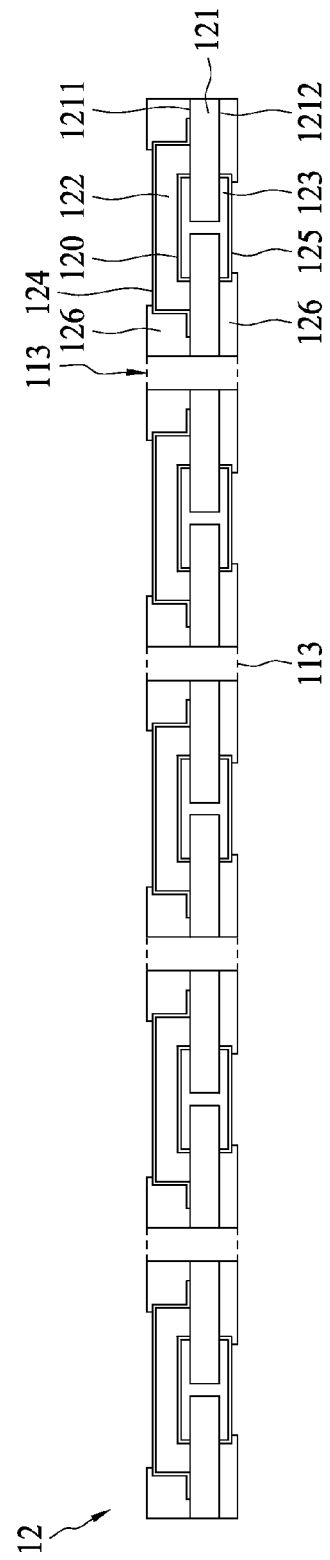

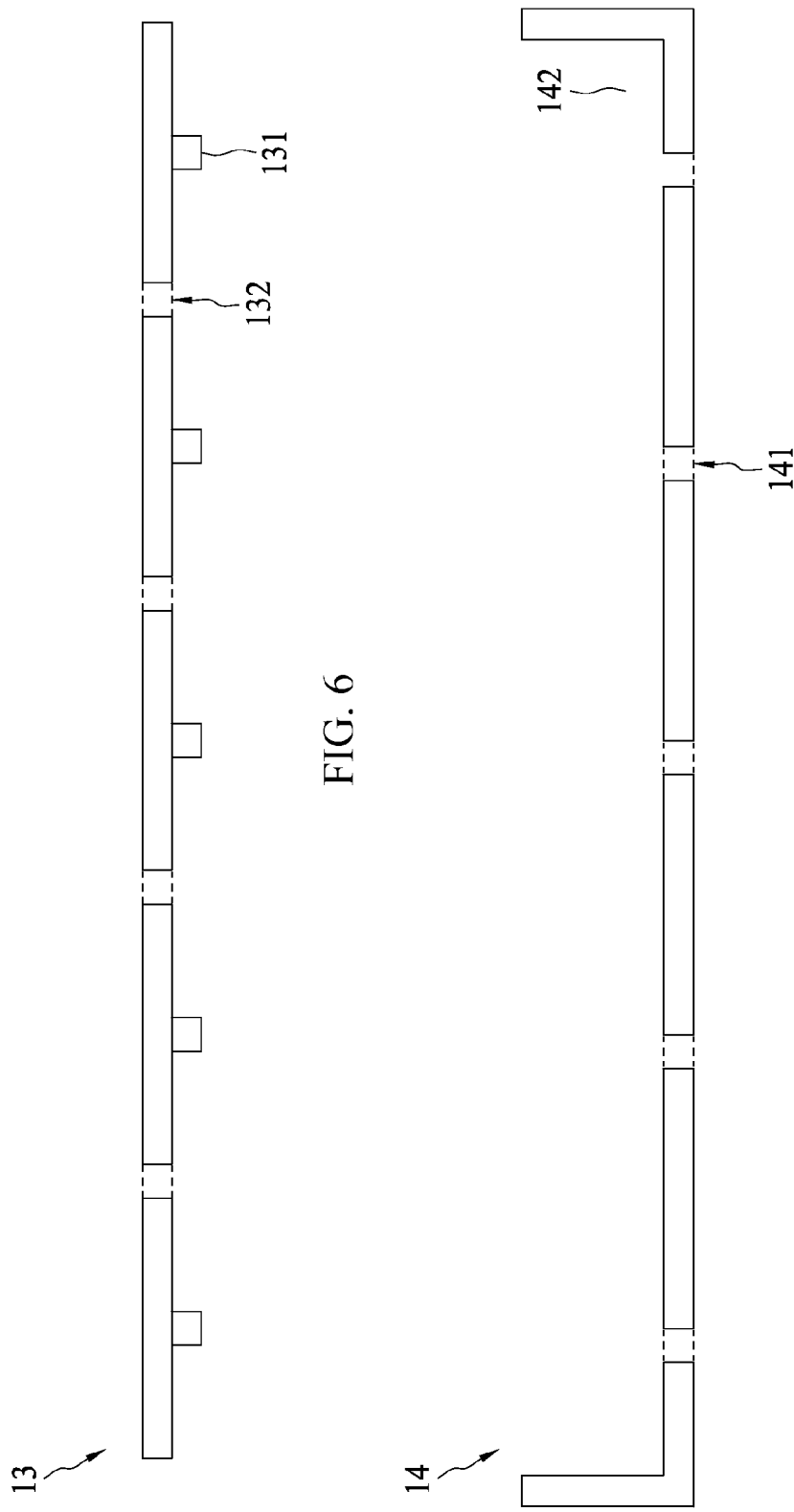

NOZZLE DEVICE WITH A PLURALITY OF PIEZOELECTRIC PLATE MODULE

BACKGROUND

1. Technical Field

The present invention relates to a nozzle device.

2. Related Art

Conventional droplet ejection apparatuses have a pressurization device, a pressurization chamber, a nozzle, and a filling hole. The nozzle communicates with the pressurization chamber. Liquid is introduced into the pressurization chamber through the filling hole. The pressurization device applies pressure on a sidewall of the pressurization chamber in order to eject droplets.

Usually, after the design of a droplet ejection apparatus is completed, it ejects droplets with a fixed size, which is not adjustable. Therefore, its application is not flexible.

SUMMARY

In one embodiment, a nozzle device comprises an upper cover module, a plurality of piezoelectric plate modules, a plug module, and a lower cover module. The upper cover module defines a cavity configured to contain fluid. Each piezoelectric plate module comprises a substrate, a piezoelectric material, an electrical connection, a plurality of upper electrodes, and a plurality of lower electrodes. The substrate comprises an upper surface, a lower surface and a first through hole disposed correspondingly to the cavity. The piezoelectric material is disposed on the upper surface of the substrate. The electrical connection extends from the lower surface of the substrate, through the substrate, and to a bottom of the piezoelectric material. The upper electrode at least extends on the piezoelectric material. The lower electrode is disposed on the lower surface of the substrate and electrically connecting to the electrical connection. The plug module comprises a plug protruding downward and a second through hole corresponding to the first through hole. The lower cover module comprises an opening disposed correspondingly to the plug of the plug module. The plurality of piezoelectric plate modules is stacked between the upper cover module and the plug module. The plug module is located between the plurality of piezoelectric plate modules and the lower cover module.

In another embodiment, a nozzle device comprises an upper cover module, a plurality of piezoelectric plate modules, a plug module, and a lower cover module. The upper cover module defines a cavity configured to contain fluid. Each piezoelectric plate module comprises two electrodes and a quartz substrate. The quartz substrate comprises a first portion between the two electrodes, a second portion thinner than the first portion, and a first through hole located at the second portion and disposed correspondingly to the cavity. The plug module comprises a plug protruding downward and a second through hole corresponding to the first through hole. The lower cover module comprises an opening disposed correspondingly to the plug of the plug module. The plurality of piezoelectric plate modules is located between the upper cover module and the plug module. The plug module is located between the plurality of piezoelectric plate modules and the lower cover module.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which:

FIG. 2 is a view showing an upper cover module according to one embodiment of the present invention;

FIG. 3 is a view showing a cover of an upper cover module according to one embodiment of the present invention;

FIG. 4 is a view showing a base of an upper cover module according to one embodiment of the present invention;

FIG. 5 is a view showing a piezoelectric plate module according to one embodiment of the present invention;

FIG. 6 is a view showing a plug module according to one embodiment of the present invention;

FIG. 7 is a view showing a lower cover module according to one embodiment of the present invention;

DETAILED DESCRIPTION OF DISCLOSED EMBODIMENTS

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

Figure 1:
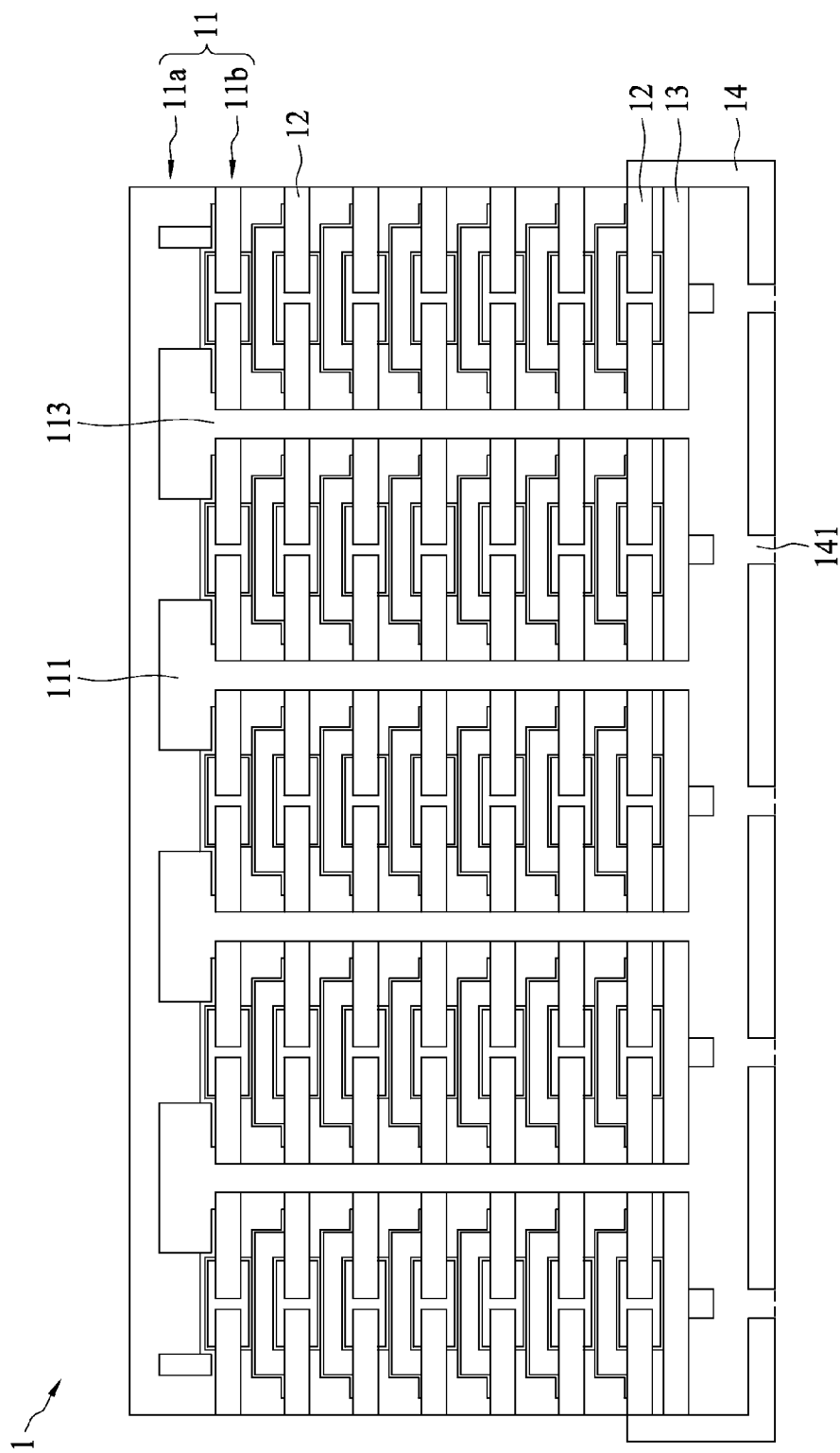
FIG. 1 is a view showing a nozzle device according to one embodiment of the present invention.

Referring to FIG. 1, in at least one embodiment, an arrayed nozzle device 1 comprises an upper cover 11, a plurality of piezoelectric plate modules 12, a plug module 13, and a lower cover module 14. The plurality of piezoelectric plate modules 12 are stacked between the upper cover 11 and the plug module 13. The plug module 13 is located between the plurality of piezoelectric plate modules 12 and the lower cover module 14. After electricity is applied to the plurality of piezoelectric plate modules 12, the plug module 13 moves, thereby driving the liquid or adhesive stored in the lower cover module 14 out through the openings of the lower cover module 14. The upper cover 11 includes a plurality of chambers or cavities 111, which are used to store refilling liquid or an adhesive. The cavities 111 may be connected with an external storage through a one-way valve so as to continuously refill liquid or an adhesive. The plurality of piezoelectric plate modules 12 may be similar to each other. By adjusting the number of piezoelectric plate modules 12, the volume of ejected liquid or adhesive droplets can be changed.

Referring to FIGS. 2 and 3, the upper cover 11 comprises a cover 11a and a base 11b. The cover 11a comprises at least one cavity 111 and at least one protrusion 112. The cavity 111 can contain liquid or an adhesive, and the liquid or adhesive includes a conductive adhesive; a mixture of plaster and water; thermal setting polymer; a mixture of silicon, boron or phosphor, and de-ionized water; and a mixture of metal powder and de-ionized water. The cover 11a is formed with a plurality of first through holes 113, which are used to externally refill liquid or an adhesive into the cavity 111. In some embodiments, the cover 11a is formed by a casting process. In some embodiments, the thickness of the cover 11a is between 1 to 2 centimeters, which should not be viewed as a limitation to the present invention. With such a thickness, the cover 11a will not deform easily. In some embodiments, the cover 11a is made of quartz or glass. The advantages of using quartz or glass are: (1) quartz or glass is transparent; therefore, the content filled inside can be examined so as to know whether there are bubbles that will affect spraying results; (2) a quartz or glass cover can be bonded with the plurality of piezoelectric plate modules 12, the plug module 13, and the lower cover module 14 by an anodic bonding process.

Referring to FIG. 4, in some embodiments, the base 11b comprises at least one first through hole 113. The at least one first through hole 113 is disposed correspondingly to the at least one cavity 111 and is configured to allow the liquid or adhesive in the cavity 111 to flow out when the liquid or adhesive is compressed by expansion of deformed piezomaterial. In some embodiments, the base 11b comprises at least one electrical connection structure 114 and a substrate 110. The at least one electrical connection structure 114 corresponds to the at least one protrusion 112 of the cover 11a. The electrical connection structure 114 comprises an electrical connection 1141, an upper electrode 1412, a lower electrode 1413, an upper dielectric layer 1414 and a lower dielectric layer 1415. The electrical connection 1141 is formed through the substrate 110 and partially extends on the upper and lower surfaces of the substrate 110. The upper electrode 1412 may cover a portion of the electrical connection 1141 that is located on the upper surface of the substrate 110. The lower electrode 1413 covers a portion of the electrical connection 1141 that is on the lower surface of the substrate 110. The upper dielectric layer 1414 covers the upper electrode 1412 and a portion of the upper surface of the substrate 110. The lower dielectric layer 1415 covers not only the edge of the lower electrode 1413 (the portion of electrical connection 1141 located on the lower surface of the substrate 110), but also a portion of the lower surface of the substrate 110. In some embodiments, the substrate 110 comprises silicon or glass. In some embodiments, the electrical connection 1141 comprises copper, and the upper electrode 1412 and the lower electrode 1413 comprise platinum. Platinum electrodes 1412 and 1413 can protect the electrical connection 1141 from oxidation by air or other substances. Furthermore, platinum electrodes 1412 and 1413 have an advantage in which the plurality of piezoelectric plate modules 12 can be bonded together as an assembly by an anodic bonding process. In some embodiments, the upper dielectric layer 1414 and the lower dielectric layer 1415 comprise silicon dioxide or silicon nitride.

In some embodiments, the cover 11a and the base 11b are bonded together by an anodic bonding process to form at least one substantially enclosed cavity 111.

In at least one embodiment, the manufacturing method for the base 11b includes steps as shown below:

A DRIE (deep reactive ion etch), ICP (inductive coupled plasma), or DRIE Bosch process, and a photolithography process are used to form deep holes with a depth of from 50 to 100 micrometers (which is not a limitation of the present invention) on the substrate 110. A photolithography and a sputtering process are applied to form a copper layer as a seed layer in a portion of the deep holes and peripheral areas around the openings thereof. Next, copper is electroplated until the copper layers over the surface of the substrate 110 reach a thickness of from 10 to 50 micrometers (which is not a limitation of the present invention). Thereafter, a chemical mechanical polishing (CMP) process is applied to grind the bottom of the substrate 110 until the copper materials in the portion of the deep holes are exposed. After the CMP process, another portion of deep holes are formed as through holes to allow liquid or adhesive to flow. Subsequently, a copper seed layer is formed on the exposed end of each copper material and a peripheral area around the exposed end. Next, copper is electroplated onto the copper seed layers until the copper seed layers reach a thickness of 10 to 50 micrometers (which is not a limitation of the present invention) so as to form the electrical connections 1141. Thereafter, a platinum electrode layer is formed on the surface of each copper material on the substrate 110. The platinum electrode layer is used as an electrode, can protect the copper material from oxidation, and is useful for a subsequent bonding process. In some embodiments, the platinum electrode layers on each electrical connection 1141 may respectively connect to a positive electrode and a negative electrode of an external power source. At least one logic switch circuit is used to control the applied voltage and the voltage pattern so as to eject liquid or adhesive droplets with different volumes. If a table carrying a workpiece is moved relatively, ejected liquid or adhesive droplets can form layers with different patterns and thicknesses. If the ejection process is repeated, different 3D patterns can be completed on the workpiece.

Referring to FIG. 5, the piezoelectric plate module 12 comprises a substrate 121, a piezomaterial 122, an electrical connection 123, an upper electrode 124, and a lower electrode 125. The substrate 121 comprises an upper surface 1211, a lower surface 1212 and a through hole 113. The through hole 113 is disposed correspondingly to a cavity 111 of the upper cover 11 so that liquid or adhesive in the cavity 111 can flow through the through hole 113. The piezomaterial 122 is disposed on the upper surface 1211 of the substrate 121. The electrical connection 123 extends from the lower surface 1212, through the substrate 121, and to the bottom of the piezomaterial 122. The upper electrode 124 extends at least on the piezomaterial 122. The lower electrode 125 is formed on the lower surface 1212 of the substrate 121 and electrically connects to the electrical connection 123. The upper electrode 124 and the lower electrode 125 are disposed substantially along the upper and lower surfaces 1211 and 1212. The upper electrode 124 may connect to a positive terminal of an external power source and the lower electrode 125 may connect to a negative terminal of the external power source. A logic switch circuit is used to respectively control the voltage and its pattern. The upper electrode 124 and the lower electrode 125 are used to apply an electric field to the piezomaterial 122, thereby causing the piezomaterial 122 to elongate along the direction of the electric field (a downward direction perpendicular to a surface of the substrate 121 in the present embodiment). In some embodiments, the substrate 121 comprises silicon or glass. In some embodiments, the upper electrode 12 comprises platinum. In some embodiments, the lower electrode 12 comprises platinum. In some embodiments, the electrical connection 123 comprises a through silicon via (TSV), or a through glass via (TGV). In some embodiments, the electrical connection 123 comprises copper.

Referring to FIG. 5, in some embodiments, a portion of the electrical connection 123 extends on the upper surface 1211 of the substrate 121. In some embodiments, the portion of the electrical connection 123 on the upper surface 1211 of the substrate 121 is covered by piezomaterial 122. In some embodiments, the upper electrode 124 covers the piezomaterial 122. In some embodiments, another portion of the electrical connection 123 extends on the lower surface 1212 of the substrate 121.

Referring to FIG. 5, the piezoelectric plate modules 12 comprises a dielectric material 126. The dielectric material 126 covers the upper surface 1211 and the lower surface 1212 of the substrate 121 and is configured to expose a portion of the upper electrode 124 and a portion of the lower electrode 125. The dielectric material 126 comprises silicon dioxide or silicon nitride.

In some embodiments, the upper electrode 124 includes a thickness of from 10 to 50 nanometers (which is not a limitation of the present invention). In some embodiments, the lower electrode 125 includes a thickness of from 10 to 50 nanometers (which is not a limitation of the present invention).

In some embodiments, the piezomaterial 122 comprises lead zirconate titanate (PZT). In some embodiments, the piezomaterial 122 comprises polyvinylidene difluoride (PVDF).

Referring to FIGS. 3 and 5, in some embodiments, the piezoelectric plate modules 12 comprises a plurality of piezomaterials 122, and the upper cover 11 is disposed with a plurality of protrusions 112 corresponding to the piezomaterials 122.

Referring to FIG. 1, in some embodiments, the piezoelectric plate modules 12 can be bonded to the upper cover 11 by an anodic bonding process. In some embodiments, one of the plurality of piezoelectric plate modules 12 is bonded onto the upper cover 11 and others are bonded one after another onto a previously bonded piezoelectric plate module 12 so as to form stacked piezoelectric plate modules 12 on the upper cover 11. The piezoelectric plate modules 12 can connect to the positive and negative terminals of different power sources, and logic switch circuits are used to control applied voltages and their patterns.

Referring to FIG. 5, the manufacturing method for a piezoelectric plate module 12 includes steps as follows:

A DRIE (deep reactive ion etch), ICP (inductive coupled plasma), or DRIE Bosch process, and a photolithography process are used to form deep holes with a depth of from 50 to 100 micrometers (which is not a limitation of the present invention) on the substrate 121. A photolithography and a sputtering process are applied to form a copper layer as a seed layer in a portion of the deep holes and peripheral areas around the openings thereof. Next, copper is electroplated until the copper layers over the surface of the substrate 121 reach a thickness of from 10 to 50 micrometers (which is not a limitation of the present invention). Thereafter, a chemical mechanical polishing (CMP) process is applied to grind the bottom of the substrate 121 until the copper materials in the portion of the deep holes are exposed. After the CMP process, another portion of deep holes are formed as through holes 113 so as to allow liquid or adhesive to flow. Subsequently, a copper seed layer is formed on the exposed end of each copper material and a peripheral area around the exposed end. Next, copper is electroplated onto the copper seed layers until the copper seed layers reach a thickness of 10 to 50 micrometers (which is not a limitation of the present invention) so as to form the electrical connections 123. Thereafter, a platinum electrode layer 120 and 125 with a thickness of from 10 to 50 nanometers (which is not a limitation of the present invention) is formed on the surface of each copper material on the substrate 110. A sol-gel process is used to form piezomaterials 122 on the substrate 121. Next, an upper electrode 124 is formed on the piezomaterial 122. Thereafter, dielectric material 126 such as silicon dioxide or silicon nitride is vapor-deposited onto two sides of the substrate 121. A photolithography process is applied to remove a portion of the dielectric material 126 so as to expose a portion of the lower electrode 125 and a portion of the upper electrode 124.

Referring to FIG. 6, the plug module 13 comprises at least one plug 131 that protrudes downwards and at least one second through hole 132. The second through hole 132 corresponds to the through hole 113 on either the upper cover 11 or the piezoelectric plate module 12. The second through hole 132 allows liquid or an adhesive stored in the cavity 111 to flow therethrough. The plug module 13 comprises silicon or quartz or glass. In some embodiments, the plug 131 comprises silicon dioxide. In some embodiments, the plug 131 comprises silicon nitride.

The manufacturing method for the plug module 13 includes steps as follows:

An SU-8 layer with a thickness of 400 to 500 micrometers (which is not a limitation of the present invention) is formed on a silicon, quartz, or glass substrate and then is baked to dry. A hole is formed, by a developer, on a location where a second through hole 132 is to be formed. A DRIE (deep reactive ion etch), ICP (inductive coupled plasma), or DRIE Bosch process is used to etch a deep hole with a depth of from 50 to 100 micrometers (which is not a limitation of the present invention). Next, the SU-8 layer is removed. Thereafter, another SU-8 layer with a thickness of 400 to 500 micrometers (which is not a limitation of the present invention) is formed on the backside of the substrate and then baked to dry. A photolithography process is used to expose the location where the plug 131 is located. Next, silicon dioxide or silicon nitride is deposited to a thickness of 250 to 350 micrometers (which is not a limitation of the present invention). The SU-8 layer is then removed.

Referring to FIG. 7, the lower cover module 14 comprises at least one opening 141 disposed correspondingly to at least one plug 131 of the plug module 13. The lower cover module 14 comprises a cavity 142, which can store liquid or an adhesive, and the plug 131 is in the cavity 142. The upper cover 11 and the lower cover module 14 are be fixed as a whole, and when electric fields are applied to the piezoelectric plate modules 12, the piezomaterials 122 may deform or elongate, causing the plug 131 to move toward a corresponding opening 141 and compress the liquid or adhesive in the cavity 142 so as to eject a portion of the liquid or adhesive out of the nozzle device 1. In some embodiments, the plug 131 has an area smaller than the area of the opening 141. A plug 131 can enter into a corresponding opening 141 by controlling voltages applied to two sides of each piezomaterial, and the plug 131 will not contact the opening 141. In some embodiments, the plug 131 has an area larger than the area of the opening 141. Under such a circumstance, voltages applied to two sides of each piezoelectric material should be limited so that the plug 31 will not contact the opening 141. In some embodiments, the lower cover module 14 comprises quartz or glass. In some embodiments, the lower cover module 14 has a thickness of from 0.5 to 2 centimeters (which is not a limitation of the present invention).

In some embodiments, the lower cover module 14 can be manufactured by steps as follows:

A quartz or glass container having a cavity is manufactured by a casting process. Thereafter, a DRIE (deep reactive ion etch), ICP (inductive coupled plasma), or DRIE Bosch process, and a photolithography process are used to etch at least one deep hole with a depth of from 50 to 100 micrometers (which is not a limitation of the present invention). Next, a CMP process is applied to remove the portion of the container below the deep hole in order to transform the deep hole into a through hole or opening 141.

In some embodiments, the plug module 13 is installed into the lower cover module 14, the periphery of the nozzle device 1 is sealed, and the nozzle device 1 is completed.

Figure 8:
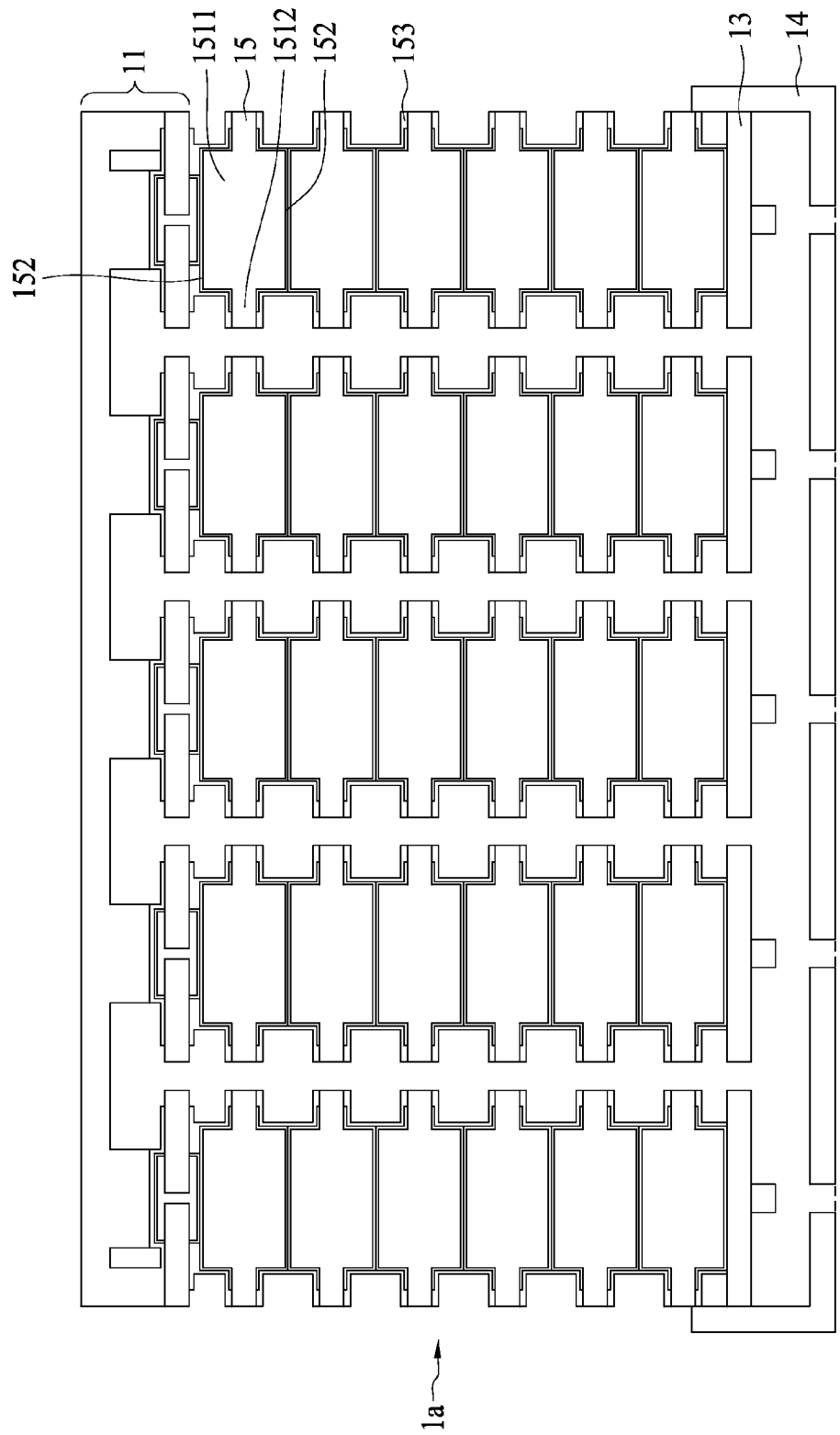
FIG. 8 is a view showing a nozzle device according to another embodiment of the present invention.

Referring to FIG. 8, a nozzle device 1a of another embodiment of the present invention is similar to the above-mentioned nozzle device 1. The main difference is that the two nozzle devices 1 and 1a have different piezoelectric plate module 12 and piezoelectric plate module 15.

Figure 9:
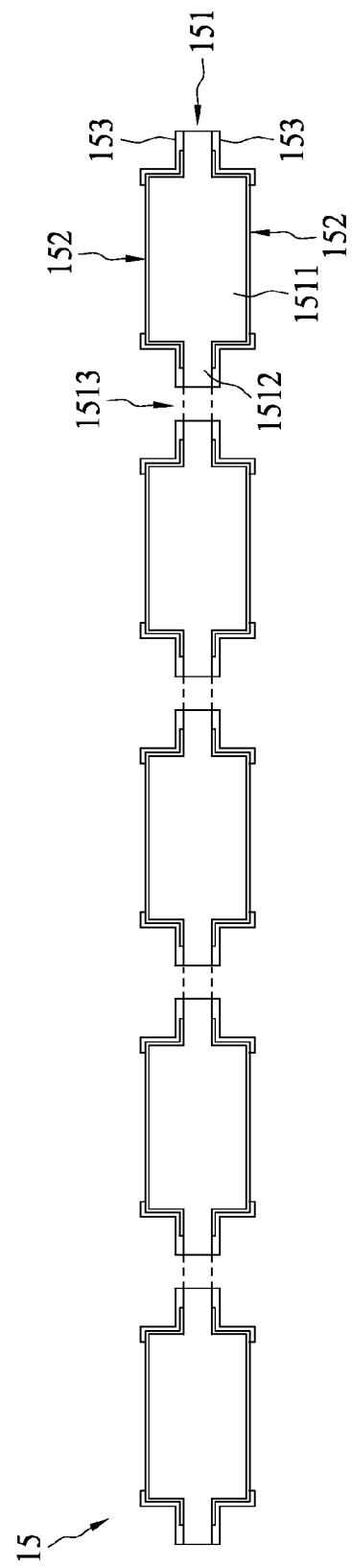
FIG. 9 is a view showing a piezoelectric plate module according to another embodiment of the present invention.

Referring to FIG. 9, the piezoelectric plate module 15 comprises a piezoelectric substrate 151 (such as quartz, PZT and PVDF) and two electrodes 152. The piezoelectric substrate 151 has at least one first portion 1511, at least one second portion 1512, and at least one through hole 1513. The first portion 1511 is thicker than the second portion 1512. The through hole 1513 is formed on the second portion 1512 and disposed correspondingly to the cavity 111 of the upper cover 11. The first portion 1511 is located between the two electrodes 152. In some embodiments, the electrode 152 covers the first portion 1511. In some embodiments, each electrode 152 extends from the first portion 1511 to the second portion 1512.

Referring to FIG. 8, in some embodiments, the piezoelectric plate module 15 comprises a dielectric material 153. The dielectric material 153 is configured to cover the second portion 1512 and the edge of the first portion 1511. In some embodiments, the piezoelectric plate module 15 comprises a dielectric material 153. The dielectric material 153 is configured to cover the second portion 1512, the edge of the first portion 1511, and the edge of the top surface of the first portion 1511. The piezoelectric plate module 15 is bonded to the upper cover 11, the plug module 13 or another piezoelectric plate module 15 by the dielectric material 153.

The piezoelectric plate module 15 is manufactured by steps as follows:

A piezoelectric quartz substrate is manufactured by a casting process. Next, a photolithography process and an etch process, such as a DRIE (deep reactive ion etch) process, a ICP (inductive coupled plasma) process, or a DRIE Bosch process, are applied to form the second portion 1512 and the through hole 1513. Thereafter, platinum electrodes 152 with a thickness of 10 to 50 nanometers (which is not a limitation of the present invention) are respectively formed on two sides of the thicker first portion 1511. Furthermore, dielectric material 153, such as silicon dioxide or silicon nitride, is vapor-deposited on two sides of the quartz substrate. Finally, a photolithography process is used to expose the electrodes on the two sides of the first portion 1511. Other portions of the quartz substrate are covered by the dielectric material 153.

Referring to FIG. 8, a plurality of piezoelectric plate modules 15 are bonded, in a repeating manner, to the upper cover 11 by an anodic bonding process. Thereafter, the plug module 13 is bonded to the outermost (or lowest) piezoelectric plate module 15. Finally, the plug module 13 is installed into the lower cover module 14, the periphery of the nozzle device 1a is sealed, and the nozzle device 1a is completed.

In at least one embodiment, the nozzle device has multiple piezoelectric plate modules. Thus, the volume of ejected liquid or adhesive droplets can be changed by adjusting the number of piezoelectric plate modules.

It will be apparent to those skilled in the art that various modifications and variations can be made to the disclosed embodiments. It is intended that the specification and examples be considered as exemplary only, with a true scope of the disclosure being indicated by the following claims and their equivalent.

What is claimed is:

1. A nozzle device comprising:
    an upper cover module defining a cavity configured to contain fluid;
    a plurality of piezoelectric plate modules each comprising:
        two electrodes; and
        a piezoelectric substrate comprising a first portion between the two electrodes, a second portion thinner than the first portion, and a first through hole located at the second portion and disposed correspondingly to the cavity;
    a plug module comprising a plug protruding downward and a second through hole corresponding to the first through hole; and
    a lower cover module comprising an opening disposed correspondingly to the plug of the plug module;
    wherein the plurality of piezoelectric plate modules are located between the upper cover module and the plug module, and the plug module is located between the plurality of piezoelectric plate modules and the lower cover module.

2. The nozzle device of claim 1, wherein each electrode extends from the first portion to the second portion.

3. The nozzle device of claim 1, wherein each electrode comprises platinum.

4. The nozzle device of claim 1, wherein the upper cover module comprises a quartz or glass cover.

5. The nozzle device of claim 4, wherein the upper cover module comprises a substrate comprising a through hole corresponding to the cavity, wherein the substrate is attached to the quartz or glass cover.

6. The nozzle device of claim 1, wherein the lower cover module comprises quartz or glass.

7. The nozzle device of claim 1, wherein the plug of the plug module is smaller than the opening of the lower cover module.

8. The nozzle device of claim 1, wherein the plug of the plug module is larger than the opening of the lower cover module.

* * * * *